United States Patent [19]

Scovell et al.

[11] Patent Number: 4,845,532

[45] Date of Patent: Jul. 4, 1989

[54] SEMICONDUCTOR DEVICES

[75] Inventors: Peter D. Scovell, Chelmsford; Peter F. Blomley, Bishops Stortford; Roger L. Baker, Chelmsford, all of Great Britain

[73] Assignee: STC PLC, London, England

[21] Appl. No.: 284,796

[22] Filed: Dec. 13, 1988

Related U.S. Application Data

[60] Continuation of Ser. No. 37,530, Apr. 13, 1987, abandoned, which is a division of Ser. No. 836,685, Mar. 6, 1986, abandoned.

[30] Foreign Application Priority Data

Mar. 23, 1985 [GB] United Kingdom ............... 8507624

[51] Int. Cl.⁴ .......................................... H01L 27/02
[52] U.S. Cl. ....................................... 357/43; 357/41; 357/42
[58] Field of Search ................... 357/41, 42, 43, 34

[56] References Cited

U.S. PATENT DOCUMENTS

| | | | |
|---|---|---|---|
| 4,120,707 | 10/1978 | Beasom | 357/43 |
| 4,233,615 | 11/1980 | Takemoto et al. | 357/41 |
| 4,239,558 | 12/1980 | Morishita | 357/34 |
| 4,503,603 | 3/1985 | Blossfeld | 357/43 |
| 4,507,847 | 4/1985 | Sullivan | 357/42 |
| 4,673,965 | 6/1987 | Rusch | 357/43 |

FOREIGN PATENT DOCUMENTS

| | | | |
|---|---|---|---|
| 0122004 | 10/1984 | European Pat. Off. | 357/34 |
| 2250570 | 4/1973 | Fed. Rep. of Germany | 357/43 |
| 54-101290 | 8/1979 | Japan | 357/43 |
| 117150 | 7/1984 | Japan | 357/43 |
| 59-117150 | 7/1984 | Japan | 357/43 |
| 59-138363 | 8/1984 | Japan | 357/43 |
| 60-38856 | 2/1985 | Japan | 357/43 |
| 2001800 | 2/1979 | United Kingdom | 357/34 |
| 2050056 | 12/1980 | United Kingdom | 357/34 |
| 2126782 | 3/1984 | United Kingdom | 357/34 |
| 2143083 | 1/1985 | United Kingdom | 357/34 |

OTHER PUBLICATIONS

"2 Micron Merged Bipolar—CMOS Tech.", Alvara et al., IEDM '84, pp. 761–764 (1984).
"An Advanced PSA Technology For High-Speed Bipolar LSI", Nakashiba et al., IEEE Journal Solid State Circuits, vol. SC 15, No. 4, pp. 455–459.
"Comparison of Experimental and Theoretical Results on (etc.)", Ashburn et al., IEEE Transactions on Electron Devices, vol. ED-31, No. 7, 1984, pp. 853–860.
"A True Polysilicon Emitter Transistor", Rowlandson et al., IEEE Electron Device Letters, 6/85, vol. ED-L-6, No. 6, pp. 288–290.

Primary Examiner—Martin H. Edlow
Attorney, Agent, or Firm—Lee & Smith

[57] ABSTRACT

A bipolar transistor structure (1) which can be used in an integrated circuit where bipolar (1) and CMOS transistors (2,3) are formed simultaneously on one substrate. In integrated circuit form the material, for example polycrystalline silicon, used for the gates (11,21) of the CMOS transistors is also used for the emitters (29) of the bipolar transistors, the collectors of the bipolar devices are comprised by doped wells (5) in the substrate (4) and the base contacts of the bipolar devices are comprised by regions (27,27a) equivalent to source and drain regions (17,18) of the n-well MOS transistors and bridged by base implants (28). The conventional CMOS processing is modified by the addition of two masking steps and one implant (base implant). One masking step defines the area for the base implant (28) and the other masking step defines an area of the oxide (30) over the base implant which must be removed to allow contact between the polycrystalline silicon (29), which is suitably doped to provide the emitter, and the base (27,27a,28). The base contacts are produced in a semi-self-aligned manner.

3 Claims, 4 Drawing Sheets

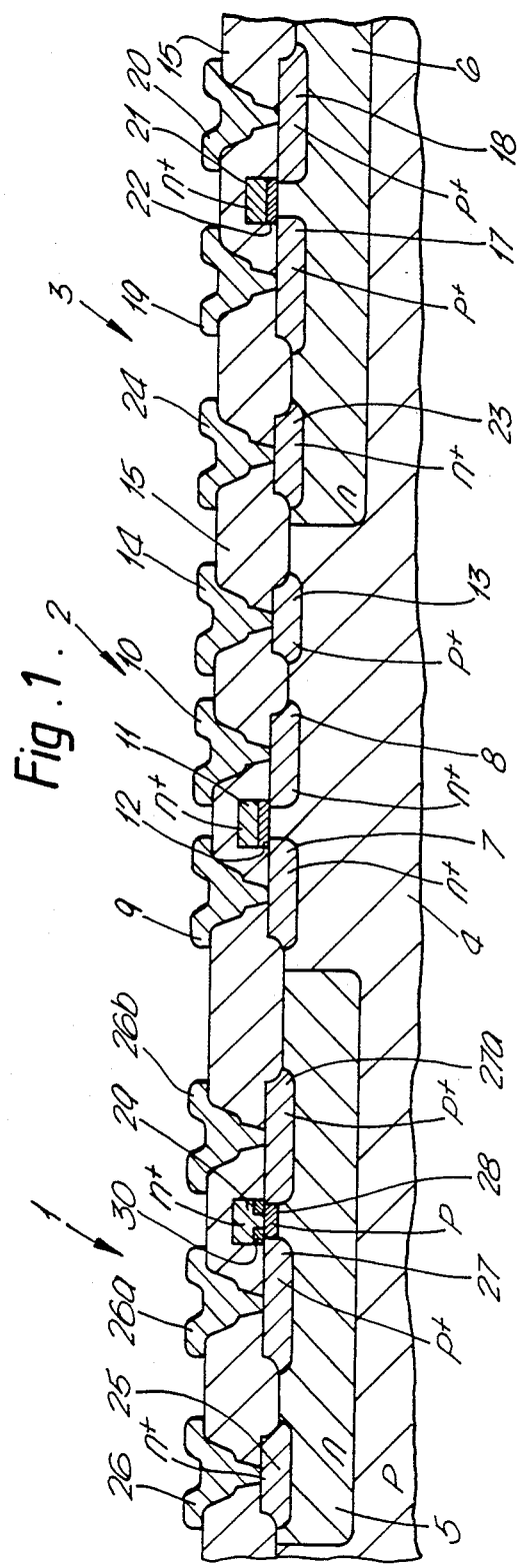
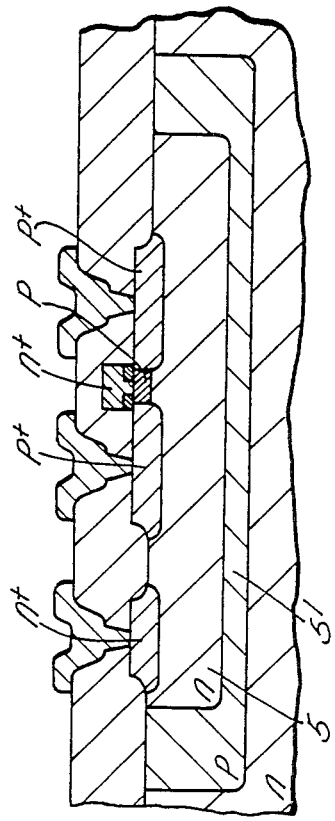
Fig. 1.
Fig. 2.

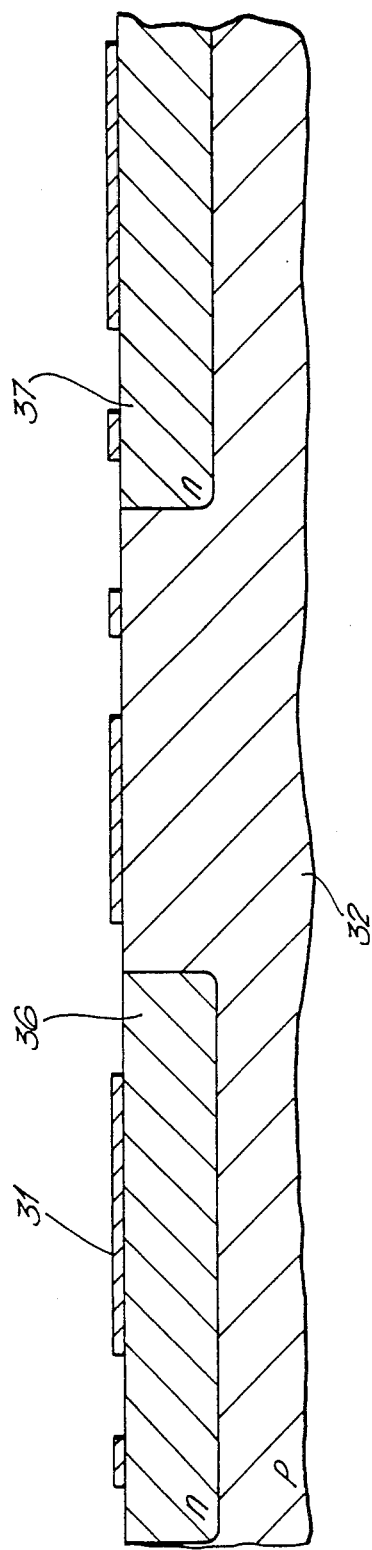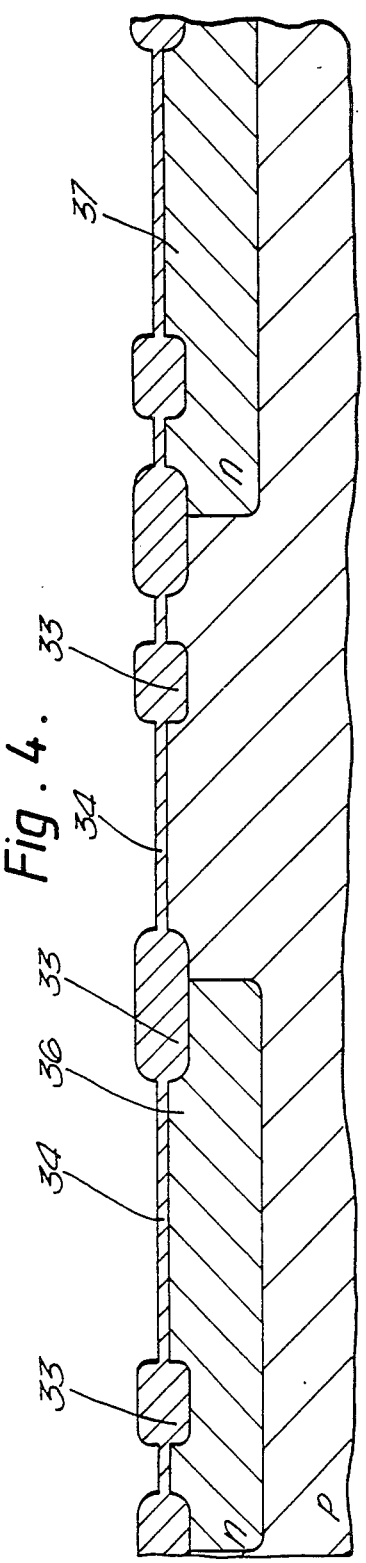

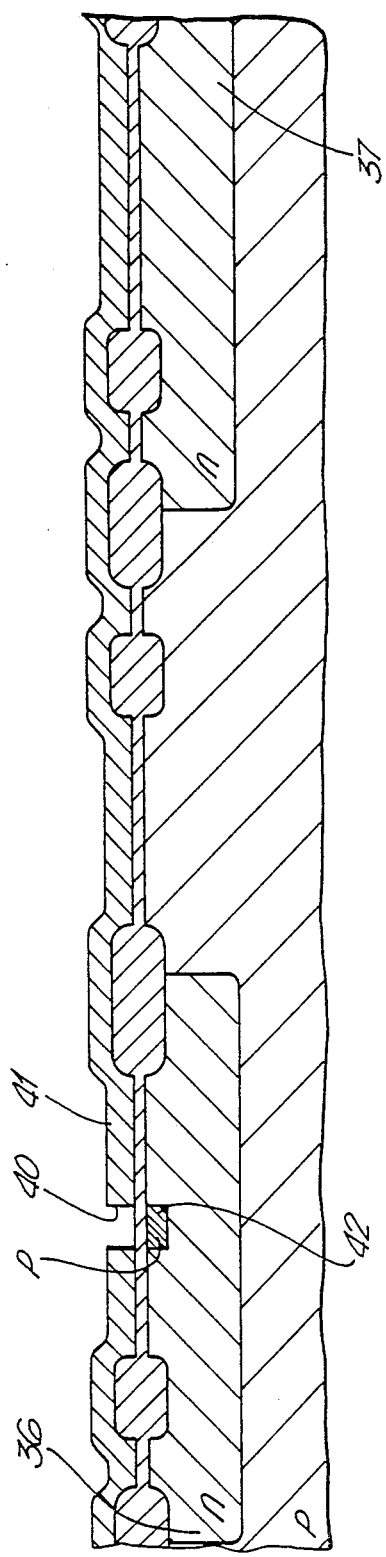

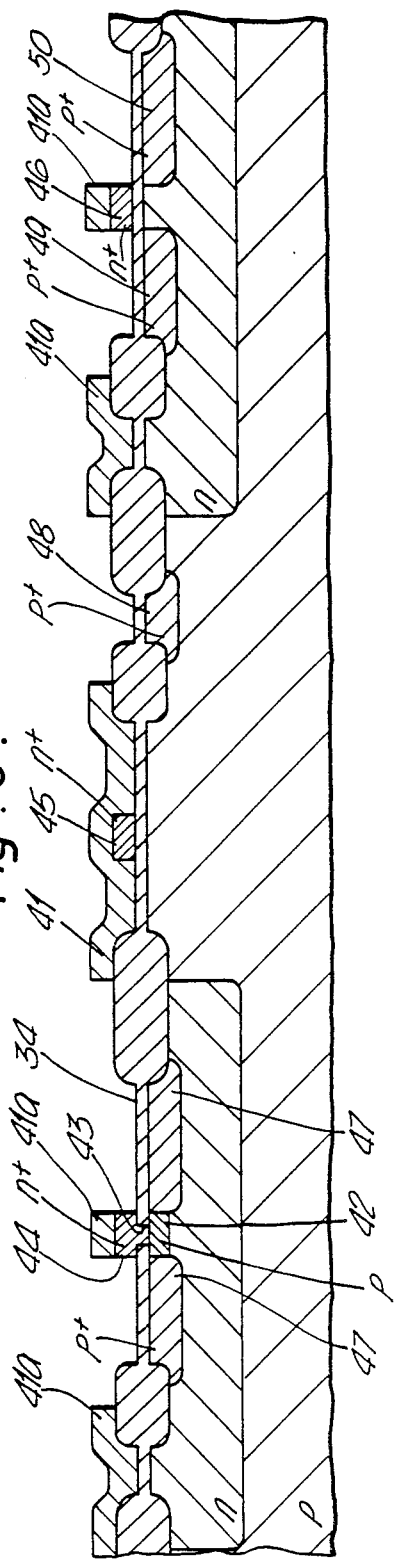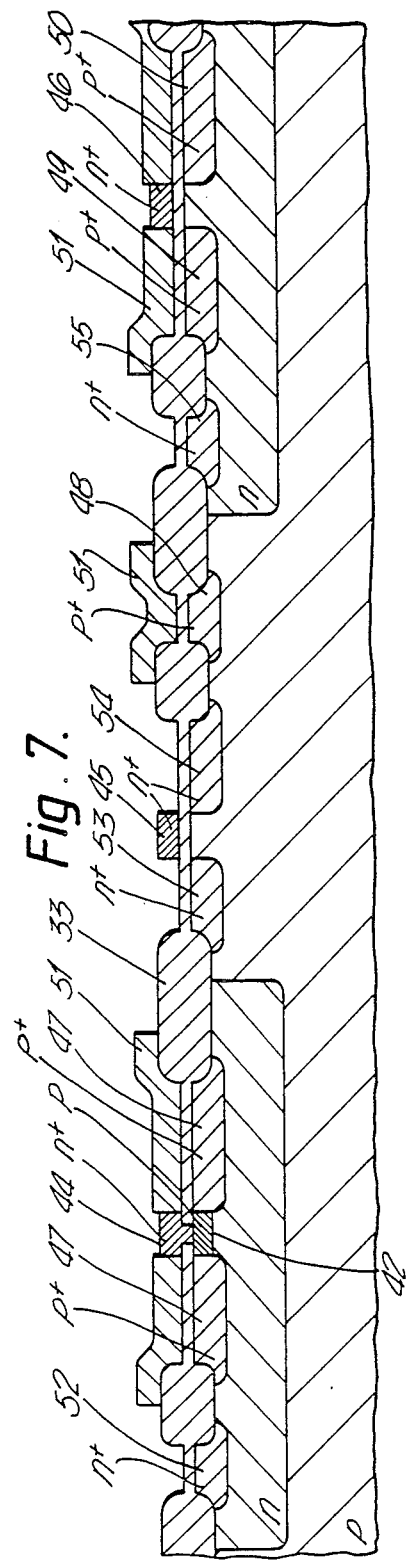

SEMICONDUCTOR DEVICES

This application is a continuation of application Ser. No. 037,530, filed Apr. 13, 1987, which is a division of application Ser. No. 836,685, filed Mar. 6, 1986, both now abandoned.

BACKGROUND OF THE INVENTION

This invention relates to semiconductor devices and in particular bipolar transistors and to integrated circuits including both bipolar and field effect, in particular CMOS (Complementary Metal Oxide Silicon), transistors.

Field effect circuits are used mainly in digital applications, whereas for analogue applications, such as in radio signal processing, bipolar circuits are more suitable. There is a need in certain applications, e.g. telephony, for the processing of both digital and analogue signals and this generally requires the provision of two circuit chips each with its associated peripheral circuitry. Many attempts have been made to combine bipolar and MOS technologies on the same chip but to date none has been entirely successful. A commonly used approach is to add a CMOS capability to a SBC (Standard Buried Collector) bipolar technology. This results in a device with high bipolar performance but poor CMOS capability. If bipolar devices are added to good CMOS technology the resulting triply diffused structures have high parasitic resistances and hence poor bipolar performance.

SUMMARY OF THE INVENTION

According to one aspect of the present invention there is provided an integrated circuit including an MOS transistor with a gate and a bipolar with an emitter of the same material as the gate.

According to another aspect of the present invention there is provided a method of manufacturing an integrated circuit including bipolar and MOS transistors including the step of forming both an MOS transistor gate and a bipolar transistor emitter from the same material.

According to another aspect of the present invention there is provided a method of manufacturing an integrated circuit including bipolar and MOS transistors including the step of forming both an MOS transistor gate and a bipolar transistor emitter from polycrystalline silicon.

According to a further aspect of the present invention there is provided a method of manufacturing a bipolar transistor with semi-self-aligned base contacts including the steps of forming a base region of one conductivity type in a surface region of the other conductivity type of a silicon substrate, forming an element on the surface and in contact with the base region, the element being doped to be of the other conductivity type and comprising the emitter of the transistor, forming a pair of base contact regions of the one conductivity type in said surface region in contact with the base region and on opposite sides thereof by implantation and using the element as a mask, and forming a collector contact of the other conductivity type in said surface region and spaced apart from the base contact regions.

BRIEF DESCRIPTION OF THE DRAWINGS

Embodiments of the invention will now be described with reference to the accompanying drawings, in which:

FIG. 1 illustrates in cross-section a bipolar/CMOS structure according to one embodiment of the present invention;

FIG. 2 illustrates the bipolar transistor of FIG. 1 formed in a p-well rather than an n-well as illustrated in FIG. 1, and FIGS. 3 to 7 illustrate in cross-section various stages in the manufacture of a bipolar/CMOS structure with n wells.

DESCRIPTION OF THE PREFERRED EMBODIMENTS

The bipolar/CMOS structure illustrated in FIG. 1 comprises a bipolar transistor 1, an n-channel MOS transistor 2 and a p-channel MOS transistor 3. The transistor 2 is formed directly in a p-type substrate 4, whereas the transistors 1 and 3 are formed in n-wells 5 and 6, respectively, provided in the substrate 4. The n-channel transistor 2 is formed by conventional CMOS processing and includes n+ source and drain regions 7 and 8 respectively, external electrical contacts 9 and 10, provided for example by metallization, to the source and drain regions 7 and 8, a polysilicon gate 11 together with gate oxide 12, a p+ contact 13 to the substrate 4, an external electrical contact 14 to the p+ contact 13, provided for example by metallization, and isolating oxide 15. The gate 11 is also externally electrically connected by means not shown. The p-channel transistor 3 is also formed by conventional CMOS processing in the n-well 6 and includes p+ source and drain regions 17 and 18, respectively, external electrical contacts 19 and 20, provided for example by metallization, to the source and drain regions 17 and 18, a polysilicon gate 21 together with gate oxide 22, an n+ contact 23 to be n-well 6, an external electrical contact 24 to the n+ contact 23, provided for example by metallization, and isolating oxide 15.

As will be appreciated from FIG. 1 the bipolar transistor 1 is very similar in cross-section to the p-channel transistor 3 and can in fact be made in integrated form with the CMOS devices by the addition of only two extra masks to number employed for the standard CMOS process. The bipolar transistor 1 employs the n-well 5 as its collector and has an n+ collector contact 25 thereto and an external electrical contact 26, provided for example by metallization. The base of transistor 1 is comprised by two p+ contact regions 27 and 27a joined by a p bridging region 28 with two external electrical contacts 26a and 26b as illustrated, and the emitter is comprised by an n+ polysilicon region 29, which contacts the p region 28, there also being an external electrical contact (not shown) to the emitter.

The bipolar transistor 1 includes elements equivalent to those of p-channel transistor 3 and manufactured concurrently therewith although the same bipolar structure may be manufactured independently thereof. The two extra masks required for the production of the polysilicon emitter transistor 1 are for defining the implant required to produce the base region 28 and for opening the oxide region 30 to bring the polysilicon into contact with the base region 28. In FIGS. 1 and 2 the gate oxide 12, 22 and the oxide region 30 are indicated separately from the remaining isolating oxide 15 although they are formed concurrently with part of the isolating oxide 15 as will be more apparent from the description of FIGS. 3 to 8.

Thus the bipolar device is fitted directly into n-well CMOS technology, the n-well being used as the collector. For use in a p-well technology an additional n implant, for example phosphorus or arsenic, is needed. This step can be implemented part of the way through the p-well drive in. Due to different thicknesses of oxides in the well and field areas a non-masked implant can be used for the n-well, although a masked implant can alternatively be used. This produces an n-well 5 within the p-well 5' (stacked wells), which again is used as the collector region of the bipolar device, as illustrated in FIG. 2.

The basic processing stages employed to fabricate the structure of FIG. 1 will now be outlined with reference to FIGS. 3 to 8. Using a first mask and photoresist (not shown) n-type wells 36 and 37 are defined in a p-type substrate 32, for example by ion implantation of phosphorous and subsequent driving-in in a conventional manner. Using a second mask (not shown ) a layer of silicon nitride 31, or silicon nitride on silicon dioxide, deposited on the surface of the p-type silicon substrate 32 is patterned to distinguish between device areas and areas in which field oxide is to be grown. Areas of nitride 31 are left on the surface of the substrate 32 at positions corresponding to the device areas, as indicated in FIG. 3. Field dopant (not shown) may be implanted into the surface of substrate 32 by use of suitable masking through the windows opened in the nitride layer 31, by for example ion implantation of boron and/or phosphorous. The substrate is then oxidized in order to form field oxide 33 in the windows. The areas of nitride 31 are etched away and the substrate further oxidized in order to obtain thin oxide areas 34 between the thick field oxide areas 33 (FIG. 4). A third mask (not shown) is employed to define a window 40 in a photoresist layer 41 (FIG. 5), through which window p-type dopant, for example boron, is ion implanted to produce a base region 42 for the bipolar transistor. This third mask is one of the additional two masks referred to above. Using a fourth mask (not shown) and an appropriate photoresist layer a window 43 is opened in the thin oxide area covering base region 42. The alignment is not critical as will be apparent from the following. If an interfacial oxide is required for the polysilicon transistor a suitable treatment can be used now. This fourth mask is the other additional mask. The photoresist is removed and a layer of undoped polycrystalline silicon deposited and ion implanted with As or P. It is then patterned to produce a polycrystalline emitter 44 and gates 45 and 46 (FIG. 6). Then with the polysilicon 44, 45 and 46 together with certain areas of the thin oxide area protected by appropriate pattern photoresist 41 and 41a p+ dopant for example boron is implanted to provide base contact regions 47 for the bipolar device, the substrate contact 48 for the n-channel MOS transistor and the source and drain regions 49 and 50 for the p-channel MOS transistor. Using a further mask a layer of photoresist 51 is appropriately patterned to define windows whereby an n+ dopant, for example arsenic, is ion implanted to provide collector contact 52 for the bipolar device, source and drain regions 53 and 54 for the n-channel MOS transistor and the well contact 55 for the p-channel MOS transistor (FIG. 7). The photoresist 51 is removed and the wafer is oxidised and a layer of P.S.G. (phosphosilicate glass) deposited to produce an "oxide" layer of the thickness of layer 15 of FIG. 1. Using another mask windows are opened in the oxide for the provision of the requisite electrical contacts to the underlying regions, the thus processed substrate is then, for example, metallized and the metal patterned as appropriate using yet another mask to produce a structure equivalent to FIG. 1. Further masking and processing may be employed as is conventional for threshold tailoring of the n-channel and p-channel MOS transistors.

By using the high efficiency polysilicon emitter structure the doping levels of the base and collector regions of the bipolar transistor can be optimised to produce low base and collector series resistance whilst still achieving a high current gain. This latitude is not available in conventional bipolar transistors.

Whilst the source and drain regions of the CMOS transistors are produced in a fully aligned manner by virtue of the polysilicon gates, the emitter of the bipolar device is only semi self-aligned with the base comprised by regions 42 and 47, although the performance is not affected thereby.

Bipolar transistors with the structure illustrated in FIG. 1 and requiring only two additional masks to a conventional CMOS process have been manufactured and found to have very high performance.

Whereas polycrystalline silicon is employed in the specific embodiments described above both for the MOS transistor gate and for the bipolar transistor emitter, this is not the only possible material. Other materials may be used to form both the MOS transistor gate and the bipolar transistor emitter provided they have suitable properties. The material may be a conductive material incorporating a source of carriers and a dopant for forming the emitter. Examples of materials which may be used instead of polycrystalline silicon are oxygen doped polysilicon, refractory metals or refractory metal silicides, amorphous silicon (hydrogenated or otherwise).

The doped polycrystalline silicon may be manufactured by a process as described in our co-pending GB application No. 8604278 (which claims priority from GB Application No. 8504725) (P. D. Scovell—R. L. Baker 11-3), Application No. 8604278 having been published under GB Serial No. 2171844A and being equivalent to U.S. patent application Ser. No. 832,043, filed Feb. 19, 1986.

ADVANTAGES PROVIDED BY THE INVENTION

A bipolar/CMOS integrated circuit is made with only minimal disturbance to standard CMOS processing. To make the bipolar transistor the CMOS processing is modified by the addition of two masks, the majority of the masks and processing required for the bipolar transistor being exactly the same as for one of the CMOS transistors. The bipolar structure produced has very high performance. This approach to the integration of bipolar and CMOS technologies provides devices capable of high performance analogue and digital functioning, the bipolar and CMOS transistors being formed simultaneously on the same chip.

We claim:

1. An integrated circuit including CMOS transistors each having a doped respective polycrystalline silicon gate and including a bipolar transistor with a doped polycrystalline silicon emitter, which polycrystalline silicon gates and emitter have the same doped levels and conductivity type, wherein the bipolar transistor has two spaced apart base contacts of one conductivity type, wherein one MOS transistor of the CMOS transistors has spaced apart source and drain regions of the one conductivity type, the said base contacts and the said source and drain regions having the same doping levels, the dimensions of the two base contacts being the same as said source and drain regions, and the spacing between the two base contacts being the same as the spacing between the source and drain regions, and wherein a bridging base region connects the two base contacts.

2. An integrated circuit including CMOS transistors each having a doped respective polycrystalline silicon gate and including a bipolar transistor with a doped polycrystalline silicon emitter, which polycrystalline gates and emitter have the same doping levels and conductivity type, wherein at least one MOS transistor of said CMOS transistor includes a well of one conductivity type in a substrate of the other conductivity type, the well extending into the substrate from a surface of the substrate; wherein the said bipolar transistor includes a respective well of the one conductivity type extending into the substrate from the said surface, which bipolar transistor well comprises the collector of the bipolar transistor; wherein the bipolar transistor has two spaced apart base contact comprising two first regions of the other conductivity type extending into said bipolar transistor well from the said surface of the substrate; wherein the at least one MOS transistor includes spaced apart source and drain regions of the other conductivity type extending into the respective MOS transistor well from the said surface of the substrate, the said two first regions and the said source and drain regions having the same doping levels, the dimensions of the first two regions being the same as the dimensions of the said source and drain regions, and the spacing between the two first regions being the same as the spacing between the said source and drain regions; wherein a bridging base region connects the said two first regions and extends into the bipolar transistor well from the said surface of the substrate; and wherein the polycrystalline silicon emitter is in contact with the bridging base region via a window in a thin oxide layer directly underlying the polycrystalline silicon emitter.

3. An integrated circuit including CMOS transistors each having a doped respective polycrystalline silicon gate and including a bipolar transistor with a doped polycrystalline silicon emitter, which polycrystalline gates and emitter have the same doping levels and conductivity type, wherein at least one MOS transistor of said CMOS transistors includes a well of one conductivity type in a substrate of the other conductivity type, the well extending into the substrate from a surface of the substrate; wherein the said bipolar transistor includes a well of the other conductivity type extending via the substrate from said surface and disposed within a well of the one conductivity type extending into the substrate from the said surface, which well of the other conductivity type comprises the collector of the bipolar transistor; wherein the bipolar transistor has two spaced apart base contacts comprising two first regions if the one conductivity type extending into said well of the other conductivity type from the said surface of the substrate; wherein at least one other MOS transistor of said CMOS transistors include spaced apart source and drain regions of the one conductivity type extending into the substrate from the said surface, the said two first regions and the said source and drain regions having the same doping levels, the dimensions of the two first regions being the same as the dimensions of the said source and drain regions, and the spacing between the two first regions being the same as the spacing between the said source and drain regions; wherein a bridging base region connects the said two first regions and extends into the well of the other conductivity type from said surface of the substrate; and wherein the polycrystalline silicon emitter is in contact with the bridging base region via a window in a thin oxide layer directly underlying the polycrystalline silicon emitter.

* * * * *